(12) United States Patent
Zou et al.

(10) Patent No.: US 11,749,772 B2
(45) Date of Patent: Sep. 5, 2023

(54) PHOTODETECTOR, MANUFACTURING METHOD THEREOF, AND LIDAR SYSTEM

(71) Applicant: PHOGRAIN TECHNOLOGY (SHENZHEN) CO., LTD., Guangdong (CN)

(72) Inventors: Yan Zou, Guangdong (CN); Hongliang Liu, Guangdong (CN); Yanwei Yang, Guangdong (CN)

(73) Assignee: PHOGRAIN TECHNOLOGY (SHENZHEN) CO., LTD., Guangdong (CN)

(\*) Notice: Subject to any disclaimer, the term of this patent is extended or adjusted under 35 U.S.C. 154(b) by 137 days.

(21) Appl. No.: 17/288,003

(22) PCT Filed: Oct. 16, 2019

(86) PCT No.: PCT/CN2019/111463
§ 371 (c)(1),
(2) Date: Apr. 23, 2021

(87) PCT Pub. No.: WO2020/083082
PCT Pub. Date: Apr. 30, 2020

(65) Prior Publication Data
US 2021/0391490 A1 Dec. 16, 2021

(30) Foreign Application Priority Data

Oct. 24, 2018 (CN) .......................... 201811246844.9

(51) Int. Cl.
*H01L 31/107* (2006.01)
*G01S 17/02* (2020.01)
(Continued)

(52) U.S. Cl.
CPC ............ *H01L 31/107* (2013.01); *G01S 17/02* (2013.01); *H01L 31/022408* (2013.01);
(Continued)

(58) Field of Classification Search
CPC .......... H01L 31/107; H01L 31/022408; H01L 31/03046; H01L 31/035272;
(Continued)

(56) References Cited

U.S. PATENT DOCUMENTS 6,515,315 B1 * 2/2003 Itzler .................. H01L 31/1075
257/E31.064
10,007,001 B1 6/2018 LaChapelle et al.
(Continued)

FOREIGN PATENT DOCUMENTS

| CN | 101552304 | 10/2009 |
| CN | 204067379 | 12/2014 |

(Continued)

OTHER PUBLICATIONS

"Search Report of Europe Counterpart Application", dated Jun. 30, 2022, pp. 1-9.
(Continued)

*Primary Examiner* — Sitaramarao S Yechuri
(74) *Attorney, Agent, or Firm* — JCIP GLOBAL INC.

(57) ABSTRACT

Provided are a photodetector, a manufacturing method thereof, and a lidar system. A photosensitive region of the photodetector is circular and has a diameter range of 100-300 μm. Compared with a conventional photodetector having a photosensitive region with a diameter of 50 μm, the photodetector of the present invention can have a detection range greater than 200 m, responsivity greater than 20 A/W and a dark current less than 10 nA.

15 Claims, 14 Drawing Sheets

(51) Int. Cl.
*H01L 31/0224* (2006.01)
*H01L 31/0304* (2006.01)
*H01L 31/0352* (2006.01)
*H01L 31/18* (2006.01)

(52) U.S. Cl.
CPC .............. *H01L 31/03046* (2013.01); *H01L 31/035272* (2013.01); *H01L 31/1844* (2013.01)

(58) Field of Classification Search
CPC ........... H01L 31/1844; H01L 31/02161; H01L 31/1075; G01S 17/02
See application file for complete search history.

(56) References Cited

U.S. PATENT DOCUMENTS

| | | |
|---|---|---|
| 2003/0137026 A1 | 7/2003 | Park |
| 2007/0096236 A1 | 5/2007 | Yagyu et al. |
| 2008/0203425 A1* | 8/2008 | Sulima ................ H01L 31/1105 257/E31.022 |
| 2009/0121305 A1* | 5/2009 | Pan ........................ H01L 31/18 438/69 |
| 2010/0019275 A1 | 1/2010 | Nakata |
| 2014/0042581 A1 | 2/2014 | Mheen et al. |
| 2017/0040368 A1 | 2/2017 | Grzesik |
| 2018/0306926 A1* | 10/2018 | LaChapelle ......... H01L 31/1085 |

FOREIGN PATENT DOCUMENTS

| | | |
|---|---|---|
| CN | 104576786 | 4/2015 |
| CN | 205542847 | 8/2016 |
| CN | 106299015 | 1/2017 |
| CN | 109216495 | 1/2019 |
| CN | 209232808 | 8/2019 |
| JP | S50110292 | 8/1975 |
| JP | H02226777 | 9/1990 |
| JP | 2000098027 | 4/2000 |
| JP | 2007080920 | 3/2007 |

OTHER PUBLICATIONS

Office Action of Japan Counterpart Application, dated Jun. 7, 2022, pp. 1-3.
"International Search Report (Form PCT/ISA/210) of PCT/CN2019/111463", dated Jan. 15, 2020, pp. 1-5.
H. R. Burris et al., "Large Diameter, High Speed InGaAs Receivers for Free-Space Lasercom", Proc. of SPIE, vol. 6551, May 2007, pp. 1-12.
"Office Action of Japan Counterpart Application", dated Jan. 4, 2023, with English translation thereof, p. 1-p. 6.

* cited by examiner

PHOTODETECTOR, MANUFACTURING METHOD THEREOF, AND LIDAR SYSTEM

CROSS-REFERENCE TO RELATED APPLICATION

This application is a 371 of international application of PCT application serial no. PCT/CN2019/111463, filed on Oct. 16, 2019, which claims the priority benefit of China application no. 201811246844.9, filed on Oct. 24, 2018. The entirety of each of the above mentioned patent applications is hereby incorporated by reference herein and made a part of this specification.

TECHNICAL FIELD

The present invention relates to the field of optical signal transmission technologies, and in particular, to a photodetector, a manufacturing method thereof, and a lidar system.

BACKGROUND

The goal of an automated vehicle driving technology is to make vehicle driving safer and make the travel more comfortable, and alleviate traffic jams to a certain extent. With the continuous development of science and technology, the automated vehicle driving technology continues to mature and improve, and advanced driver assistance systems (ADAS) are now well integrated in vehicles and have some automated driving functions.

A main component for implementing automated vehicle driving is an in-vehicle sensor. With the development of automated driving, new technical challenges will be presented to in-vehicle sensors. It is generally believed in the industry that a lidar system is the best solution to the above challenges. This technology has proven its accuracy and reliability in ADAS applications. In addition, the ever-enhancing functions and portability of the lidar system are making it integrated into more in-vehicle functions.

For the lidar system, the key choice is the optical wavelength. The two currently most popular wavelengths are 905 nm and 1550 nm. Although crystalline silicon has the advantages of being easy to purify and dope and having high temperature resistance, etc., the crystalline silicon cannot absorb light waves with a wavelength greater than 1100 nm. When incident light has a wavelength greater than 1100 nm, the light absorption and response rate of a silicon detector will be greatly reduced. When the wavelength is shorter, the damage to the human body is greater. Therefore, it is more suitable to adopt an InGaAs avalanche photodetector with a response wavelength of 1550 nm for the lidar system. However, the existing InGaAs avalanche photodetectors are generally used for optical fiber communication, have a short detection range, and have low responsivity.

SUMMARY

In order to solve the above problems, the technical solutions of embodiments of the present invention provide a photodetector, a manufacturing method thereof, and a lidar system, such that the photodetector improves the detection range and responsivity.

To achieve the above objective, an embodiment of the present invention provides the following technical solutions:

A photodetector is an avalanche photodetector for a lidar system, and the photodetector includes:
a chip substrate;
an epitaxial functional layer, wherein the epitaxial functional layer is arranged on a surface of one side of the chip substrate; the epitaxial functional layer includes a circular photosensitive region, and a range of a diameter of the photosensitive region is 100 μm-300 μm;
a first electrode arranged on a surface of one side of the epitaxial functional layer facing away from the chip substrate; and
a second electrode arranged on a surface of the other side of the chip substrate.

Optionally, in the above photodetector, the epitaxial functional layer includes a buffer layer, an absorption layer, a transition layer, a field control layer, a top layer, and a contact layer which are sequentially arranged on the chip substrate;
wherein the absorption layer is an InGaAs absorption layer.

Optionally, in the above photodetector, the epitaxial functional layer has a Zn diffusion region, and the Zn diffusion region includes a first diffusion region and a second diffusion region surrounding the first diffusion region;
a diffusion depth of the first diffusion region is H1, a diffusion depth of the second diffusion region is H2, a thickness of the contact layer is h1, a thickness of the top layer is h2, and a thickness of the field control layer is h3;
wherein h1<H1<h1+h2, h1+h2<H2<h1+h2+h3.

Optionally, in the above photodetector, a thickness of the absorption layer is less than 3.5 μm.

Optionally, in the above photodetector, the chip substrate is an N-type semi-insulating InP substrate; the buffer layer is an InP buffer layer; the transition layer is an InGaAsP transition layer; the field control layer is an InP field control layer; the top layer is an InP top layer; and the contact layer is an InGaAsP contact layer.

Optionally, in the above photodetector, the surface of one side of the epitaxial functional layer facing away from the chip substrate is provided with a passivation film, the passivation film surrounds the photosensitive region, a first electrode through hole is formed between the passivation film and the photosensitive region, and the first electrode is in electrical contact with the epitaxial functional layer through the first electrode through hole.

Optionally, in the above photodetector, the passivation film includes a silicon nitride layer and a silicon oxide layer which are laminated.

Optionally, in the above photodetector, a surface of the photosensitive region is covered with an antireflection film.

Optionally, in the above photodetector, a diameter of the photosensitive region is 200 μm.

An embodiment of the present invention further provides a manufacturing method for a photodetector, including:
providing a wafer, wherein the wafer includes a plurality of chip substrates, and a cutting channel is provided between adjacent chip substrates;
forming an epitaxial functional layer on a surface of one side of the wafer, wherein the epitaxial functional layer corresponding to each of the chip substrates comprises a circular photosensitive region, and a range of a diameter of the photosensitive region is 100 μm-300 μm;
forming a patterned first electrode layer on one side of the epitaxial functional layer facing away from the wafer, wherein the first electrode layer includes first electrodes in one-to-one correspondence with the chip substrates;
forming a second electrode layer on the other side of the wafer; and
segmenting the wafer based on the cutting channel to form a plurality of single-particle photodetectors; wherein after segmentation, the second electrode layer forms a plurality of second electrodes in one-to-one correspondence with the chip substrates.

Optionally, in the above manufacturing method, forming the epitaxial functional layer on a surface of one side of the wafer includes:

sequentially growing a buffer layer, an absorption layer, a transition layer, a field control layer, a top layer, and a contact layer on the wafer;

wherein the absorption layer is an InGaAs absorption layer.

Optionally, in the above manufacturing method, the epitaxial functional layer has a Zn diffusion region, and the Zn diffusion region includes a first diffusion region and a second diffusion region surrounding the first diffusion region, and a method for forming the Zn diffusion region includes:

forming a passivation film on a surface of the contact layer;

patterning the passivation film to form a first annular region as a first diffusion window; wherein the passivation film corresponding to each of the chip substrates is provided with one first annular region;

performing a first Zn diffusion based on the first diffusion window;

removing the passivation film in the first annular region to form a second diffusion window; and performing a second Zn diffusion based on the first diffusion window and the second diffusion window to form the first diffusion region and the second diffusion region.

Optionally, in the above manufacturing method, a diffusion depth of the first diffusion region is H1, a diffusion depth of the second diffusion region is H2, a thickness of the contact layer is h1, a thickness of the top layer is h2, and a thickness of the field control layer is h3;

wherein h1<H1<h1+h2, h1+h2<H2<h1+h2+h3.

Optionally, in the above manufacturing method, forming the patterned first electrode layer on one side of the epitaxial functional layer facing away from the wafer includes:

forming an antireflection film covering the first diffusion window and the second diffusion window;

forming an annular opening on the antireflection film, wherein the region surrounded by the annular opening is the photosensitive region, and the annular opening is used as a first electrode through hole; and forming the first electrode layer on surfaces of both the antireflection film and the passivation film, and patterning the first electrode layer to form a plurality of first electrodes in one-to-one correspondence with the chip substrates, wherein the first electrodes are each in electrical contact with the diffusion region through the corresponding first electrode through hole.

An embodiment of the present invention further provides a lidar system, including the photodetector described in any one of the above.

It can be seen from the above description that in the photodetector, the manufacturing method thereof, and the lidar system provided by the technical solutions of the embodiments of the present invention, a photosensitive region of the photodetector is a circular region with a diameter range of 100-300 μm. Compared with a conventional photodetector having a photosensitive region with a diameter of 50 μm, the photodetector of the present invention can have a detection range greater than 200 m, responsivity greater than 20 A/W and a dark current less than 10 nA.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description merely show some embodiments of the present invention, and those of ordinary skill in the art may still derive other accompanying drawings from these accompanying drawings without creative efforts.

DESCRIPTION OF EMBODIMENTS

In order to make the objectives, technical solutions and advantages of embodiments of the present application clearer, the technical solutions in the embodiments of the present application are clearly and completely described below with reference to the drawings for the embodiments of the present application. Apparently, the described embodiments are some of, rather than all of, the embodiments of the present application. Based on the embodiments given in the present application, all other embodiments obtained by those of ordinary skill in the art without creative efforts shall all fall within the protection scope of the present application.

In the detection of infrared single photons, compared with silicon avalanche photodetectors, existing InGaAs avalanche photodetectors have problems such as poor detection efficiency, large background noise, etc., and have a small detection range. A photodetector provided in the embodiment of the present invention is an InGaAs avalanche photodetector, which can be used to respond to signals with a wavelength of 1550 nm and has the advantages of high detection efficiency, low background noise, large detection range, and high responsivity.

To make the above objective, features, and advantages of the present invention clearer and more comprehensible, the present invention is further described in detail below with reference to the accompanying drawings and specific embodiments.

Figure 1:
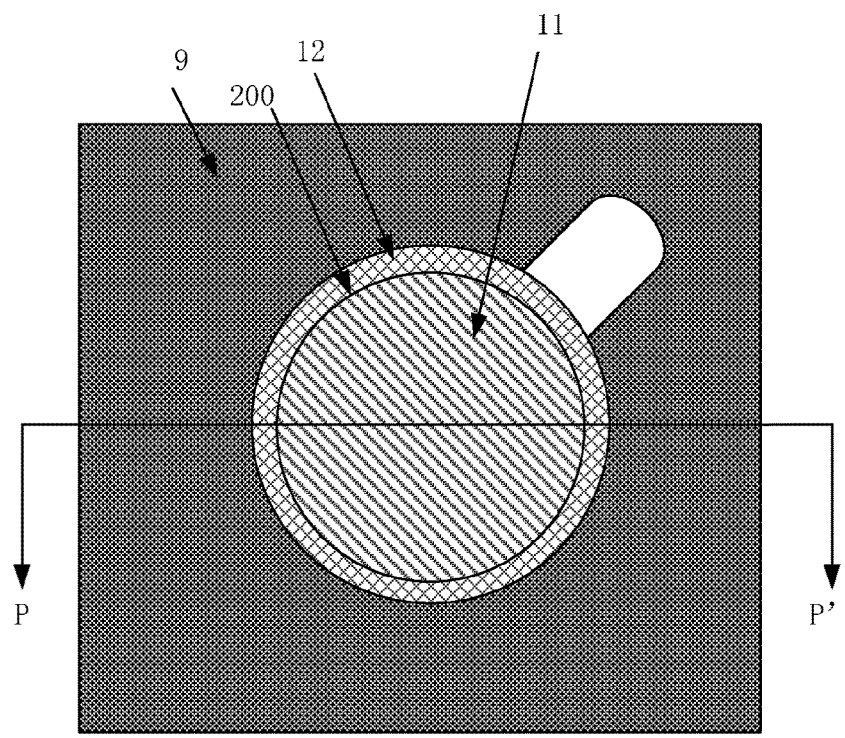
FIG. 1 is a front top view of a photodetector according to an embodiment of the present invention.
Figure 2:
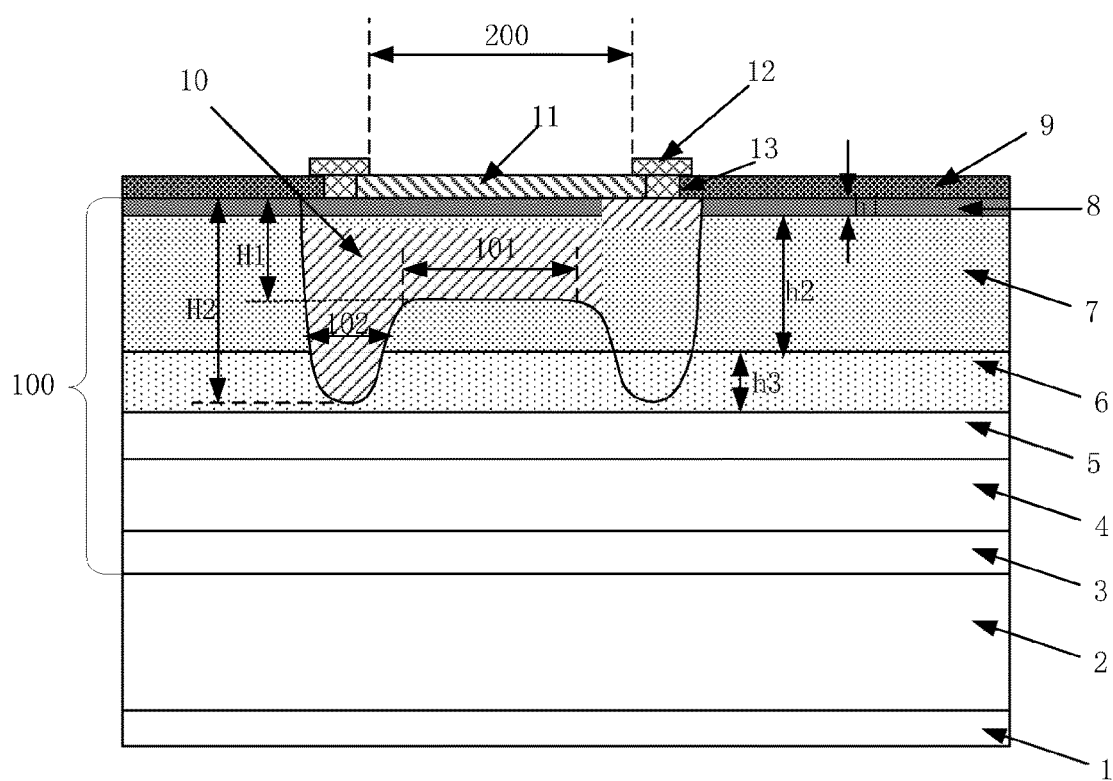
FIG. 2 is a cross-sectional view of the photodetector shown in FIG. 1 in a P-P' direction.

Referring to FIG. 1 and FIG. 2, FIG. 1 is a front top view of a photodetector according to an embodiment of the present invention, and FIG. 2 is a cross-sectional view of the photodetector shown in FIG. 1 in a P-P' direction. The photodetector according to the embodiment of the present invention includes: a chip substrate 2; and an epitaxial functional layer 100, wherein the epitaxial functional layer 100 is arranged on a surface of one side of the chip substrate 2. The epitaxial functional layer 100 includes a circular photosensitive region 200, and a range of a diameter of the photosensitive region 200 is 100-300 μm.

The photodetector further includes a first electrode 12 and a second electrode 1. The first electrode 12 is arranged on a surface of one side of the epitaxial functional layer 100 facing away from the chip substrate 2; and the first electrode 12 is annular and surrounds the photosensitive region 200. The first electrode 12 is in electrical contact with the epitaxial functional layer 100. The second electrode 1 is arranged on a surface of the other side of the chip substrate 2. The second electrode 1 completely covers the surface of the other side of the chip substrate 2.

The photodetector in the embodiment of the present invention is an InGaAs avalanche photodetector, and a range of a diameter of the photosensitive region 200 is 100 µm-300 µm. In the conventional InGaAs avalanche photodetector, its photosensitive region has a diameter of only 50 µm, which is used for short-distance optical fiber communication. Compared with the existing structure, the photodetector according to the embodiment of the present invention increases the size of the photosensitive region, improves the detection efficiency, the detection range and the responsivity, and reduces the background noise.

As shown in FIG. 2, the epitaxial functional layer 100 includes a buffer layer 3, an absorption layer 4, a transition layer 5, a field control layer 6, a top layer 7, and a contact layer 8 which are sequentially arranged on the chip substrate, wherein the absorption layer 4 is an InGaAs absorption layer. The epitaxial functional layer 100 of this structure matches the photosensitive region 200 of the above size, which can greatly improve the detection range and responsivity of the photodetector.

The epitaxial functional layer 100 has a Zn diffusion region 10 to form a PN junction at the epitaxial functional layer 100 to convert optical signals into electrical signals. The Zn diffusion region 10 includes a first diffusion region 101 and a second diffusion region 102 surrounding the first diffusion region 101; a diffusion depth of the first diffusion region 101 is H1, a diffusion depth of the second diffusion region is H2, a thickness of the contact layer is h1, a thickness of the top layer is h2, and a thickness of the field control layer is h3

Wherein, h1<H1<h1+h2, h1+h2<H2<h1+h2+h3. In this way, the edge breakdown effect of the diffusion region 10 can be suppressed while the detection range and responsivity of the photodetector are improved, and a photocurrent can be generated under a zero-volt bias.

As shown in FIG. 2, the Zn diffusion region 10 has a greater outer diameter than that of the photosensitive region 200, so that optical signals incident on the detector through the photosensitive region 200 can enter the Zn diffusion region and be converted into electrical signals.

In the photodetector according to the embodiment of the present invention, a thickness of the absorption layer 4 is less than 3.5 µm. Compared with the existing structure, the photodetector has a photosensitive region 200 with an increased size, and the thickness can be reduced.

The chip substrate 2 is an N-type semi-insulating InP substrate; the buffer layer 3 is an InP buffer layer; the transition layer 5 is an InGaAsP transition layer; the field control layer 6 is an InP field control layer; the top layer 7 is an InP top layer; and the contact layer 8 is an InGaAsP contact layer. The chip substrate 2 and the epitaxial functional layer 100 in the above implementation match the photosensitive region 200 of the above size, which can greatly improve the detection range and responsivity of the photodetector.

In the embodiment of the present invention, the surface of one side of the epitaxial functional layer 100 facing away from the chip substrate 2 is provided with a passivation film 9, the passivation film 9 surrounds the photosensitive region 200, a first electrode through hole 13 is formed between the passivation film 9 and the photosensitive region 200, and the first electrode 12 is in electrical contact with the epitaxial functional layer 100 through the first electrode through hole 13. Optionally, the passivation film 9 includes a silicon nitride layer and a silicon oxide layer which are laminated, wherein the order of forming the silicon nitride layer and the silicon oxide layer can be adjusted as required, which is not limited in the present application.

In order to increase the transmittance of the photosensitive region 200 and improve the detection sensitivity, a surface of the photosensitive region 200 is covered with an antireflection film 11.

In the embodiment of the present invention, a diameter of the photosensitive region 200 is 200 µm. When the diameter of the photosensitive region 200 is 200 µm, the detection range and responsivity can be maximized, and a dark current and background noise can be reduced to a greater extent.

From the above description, it can be seen that the photodetector according to the embodiment of the present invention has many advantages such as high detection efficiency, low background noise, large detection range, and high responsivity, and can be used in an in-vehicle lidar system to better detect light wave signals with a wavelength of 1550 nm.

Based on the above embodiment, another embodiment of the present invention further provides a manufacturing method for the photodetector described in the above embodiment. The manufacturing method is shown in FIGS. 3-15. FIGS. 3-15 are schematic flowcharts of the manufacturing method for a photodetector according to an embodiment of the present invention, and the manufacturing method includes the following steps.

Figure 3:
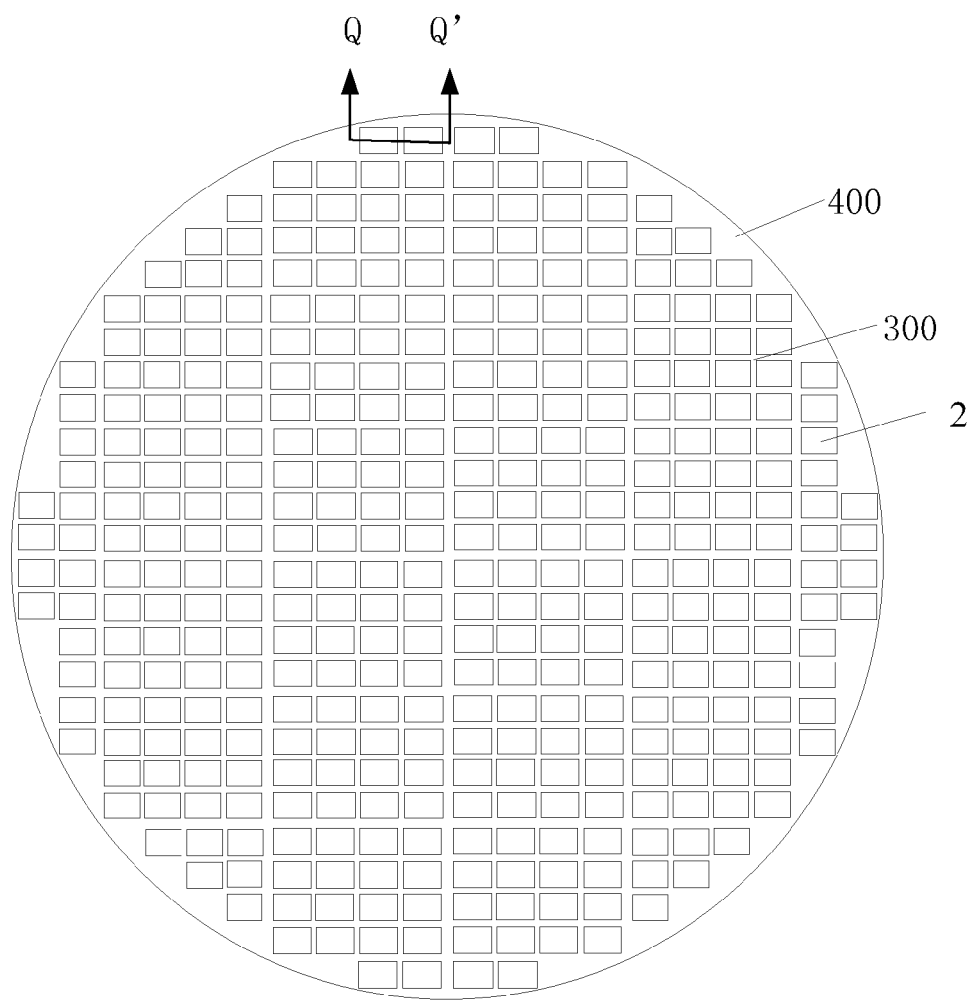
FIGS. 3-15 are schematic flowcharts of a manufacturing method for a photodetector according to an embodiment of the present invention.
Figure 4:
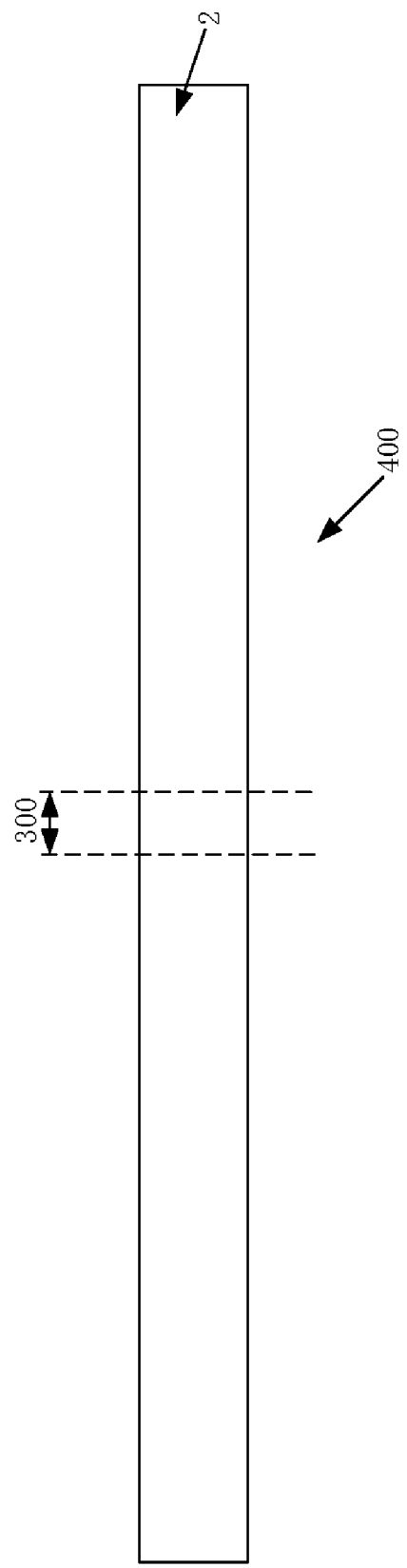

Step S11: As shown in FIG. 3 and FIG. 4, provide a wafer 400.

FIG. 3 is a top view of the wafer 400, and FIG. 4 is a cross-sectional view of the wafer 400 shown in FIG. 3 in a Q-Q' direction. The wafer 400 includes a plurality of chip substrates 2, and a cutting channel 300 is provided between adjacent chip substrates 2.

Step S12: As shown in FIGS. 5-10, form an epitaxial functional layer 100 on a surface of one side of the wafer.

The epitaxial functional layer 100 corresponding to each of the chip substrates 2 includes a circular photosensitive region 200, and a range of a diameter of the photosensitive region 200 is 100 µm-300 µm.

Figure 5:
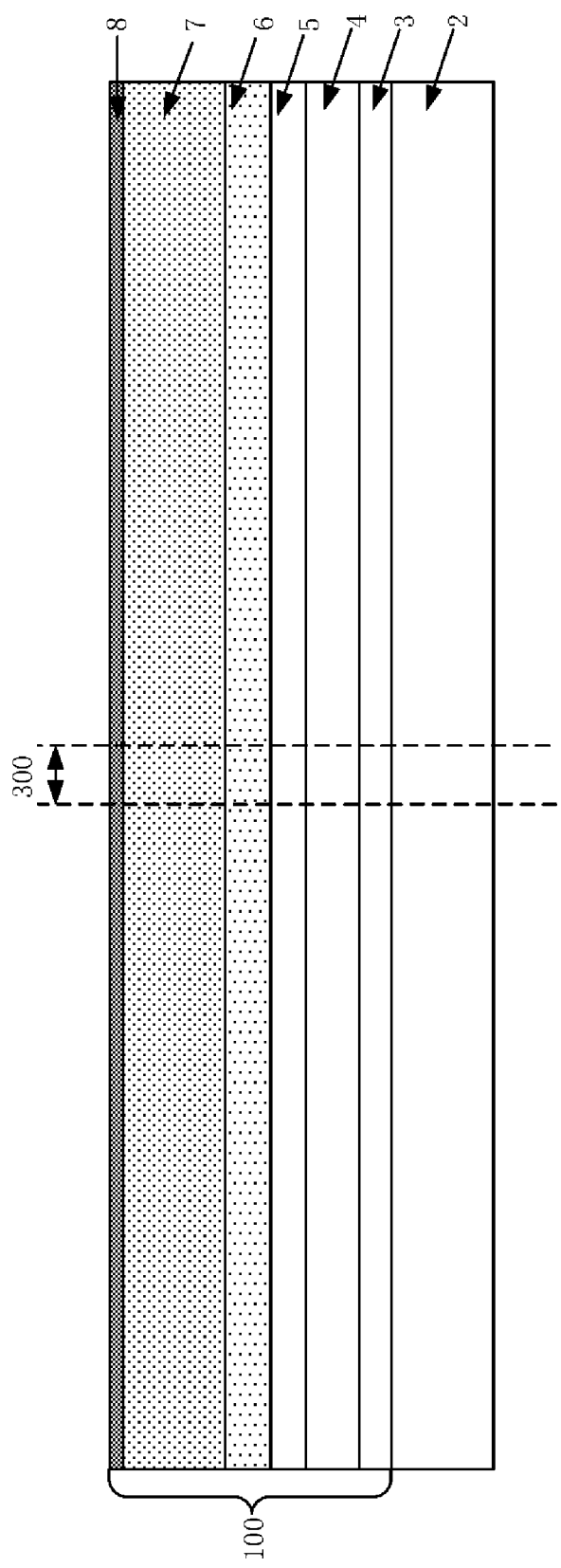

In this step, the forming an epitaxial functional layer 100 on a surface of one side of the wafer includes: as shown in FIG. 5, sequentially growing a buffer layer 3, an absorption layer 4, a transition layer 5, a field control layer 6, a top layer 7, and a contact layer 8 on the wafer, wherein the absorption layer 4 is an InGaAs absorption layer.

An MOCVD epitaxial growth device may be used to sequentially form each layer of structure of the epitaxial functional layer 100. The wafer is an N-type semi-insulating InP wafer, so that the chip substrates 2 are each an N-type semi-insulating InP substrate. The InP buffer layer 3 with a thickness greater than 1 µm and a doping concentration greater than $1\times10^{17}$ cm$^{-3}$, the InGaAs absorption layer 4 with a thickness less than 3.5 µm and a doping concentration less than $5\times10^{14}$ cm$^{-3}$, the InGaAsP transition layer 5 with cut-off wavelengths of 1.45 µm, 1.25 µm, and 1.05 µm respectively and a thickness less than 0.1 µm, the InP field control layer 6 with a thickness less than 0.25 µm and a doping concentration greater than $1\times10^{17}$ cm$^{-3}$, the InP top layer 7 with a thickness greater than 3.5 µm and a doping concentration less than $1\times10^{15}$ cm$^{-3}$, and the InGaAsP contact layer 8 with a thickness less than 0.2 µm and a cut-off wavelength of 1.05 µm are sequentially grown on the wafer.

The epitaxial functional layer has a Zn diffusion region 10, and the Zn diffusion region 10 includes a first diffusion region 101 and a second diffusion region 102 surrounding the first diffusion region 101, and a method for forming the Zn diffusion region 10 includes the following steps.

Figure 6:
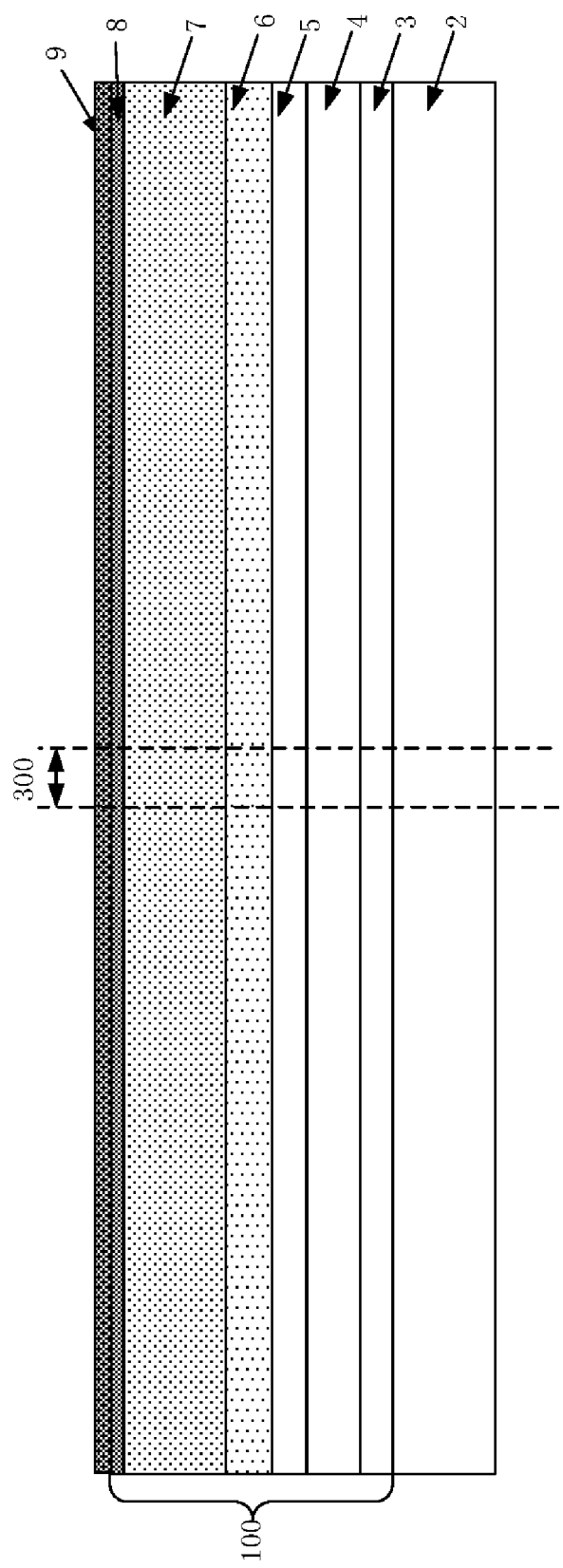

First, as shown in FIG. 6, a passivation film 9 is formed on a surface of the contact layer 8. The passivation film 9 can be formed using a PECVD device.

Figure 7:
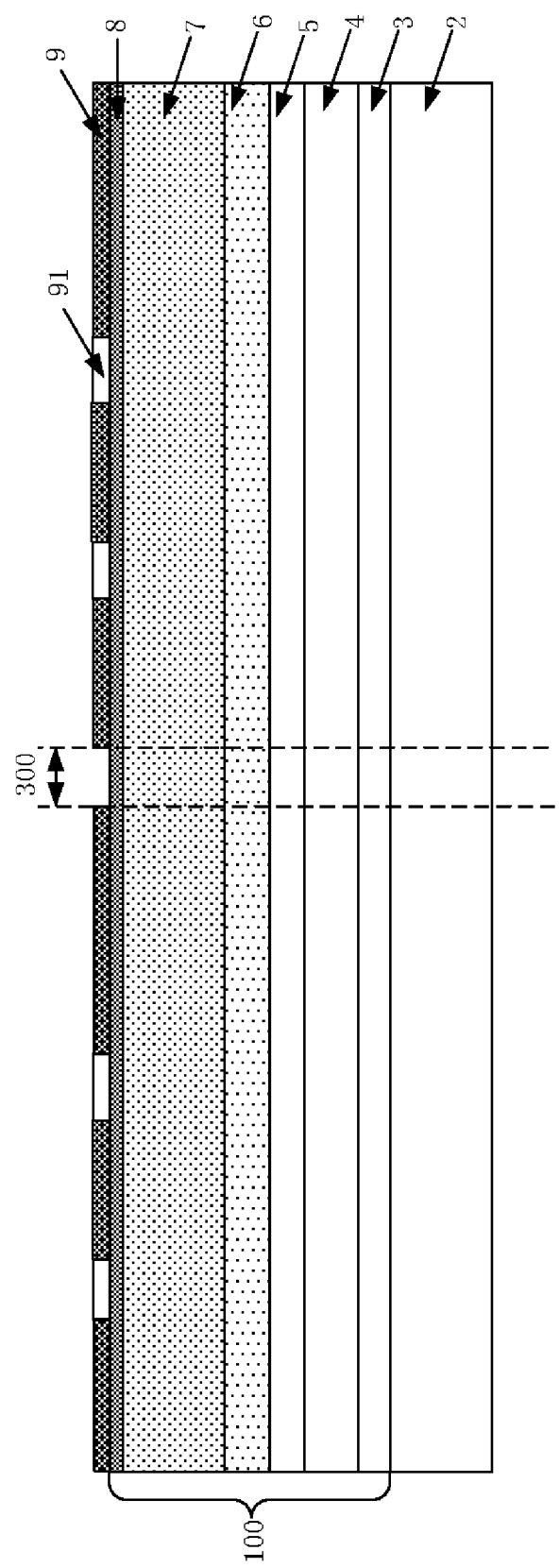

Then, as shown in FIG. 7, the passivation film 9 is patterned to form a first annular region as a first diffusion window 91. The passivation film corresponding to each of the chip substrates 2 is provided with one first annular region. For the same chip substrate 2, a vertical projection of the first annular region on the epitaxial functional layer 100 surrounds the photosensitive region 200. The outer diameter of the first annular region surrounds the photosensitive region 200. In this step, the passivation film 9 can be patterned by photolithography, reactive ion etching (RIE), or wet etching. The passivation film 9 includes a silicon nitride layer and a silicon oxide layer which are laminated, wherein the order of forming the silicon nitride layer and the silicon oxide layer can be adjusted as required, which is not limited in the present application.

When the first annular region is formed, the passivation film 9 at the cutting channel 300 can be synchronously removed to facilitate subsequent cutting. It is also possible to retain the passivation film 9 at the cutting channel 300, and subsequently directly remove the passivation film 9 at the cutting channel 300 through cutting.

Figure 8:
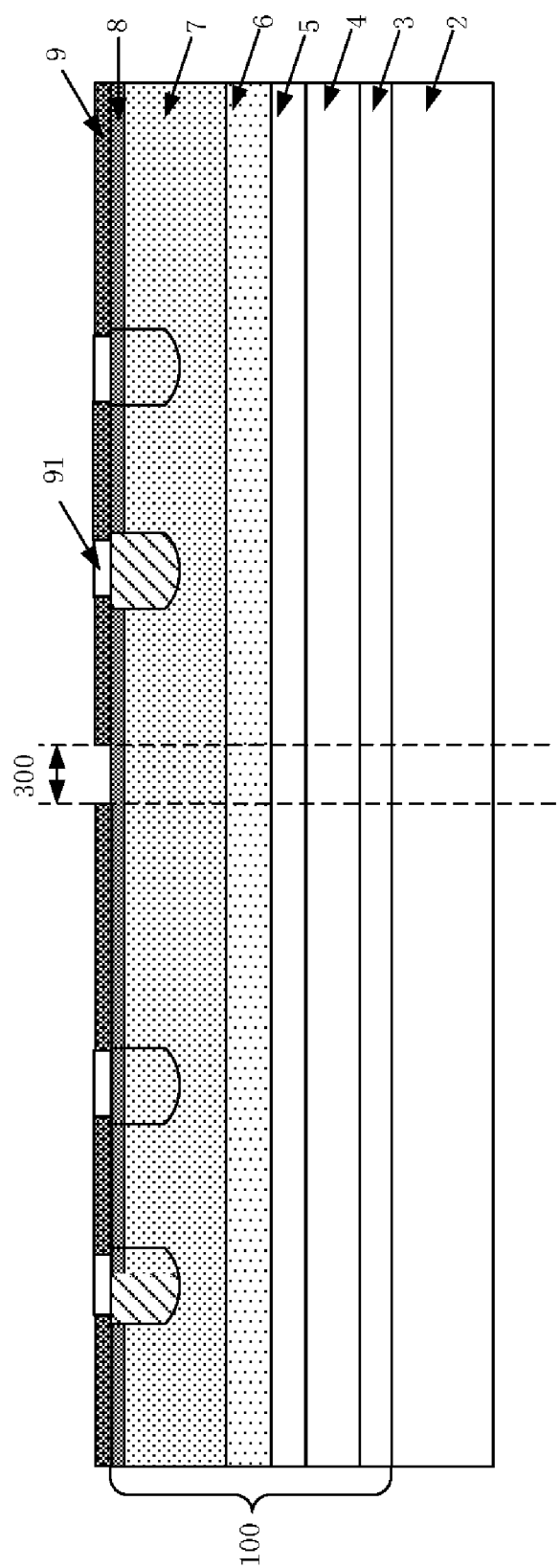

As shown in FIG. 8, first Zn diffusion is performed based on the first diffusion window. The diffusion region formed by the first Zn diffusion is in a ring shape. Due to transverse diffusion, the width of the ring shape is greater than the width of the ring shape corresponding to the first diffusion window 91.

Figure 9:
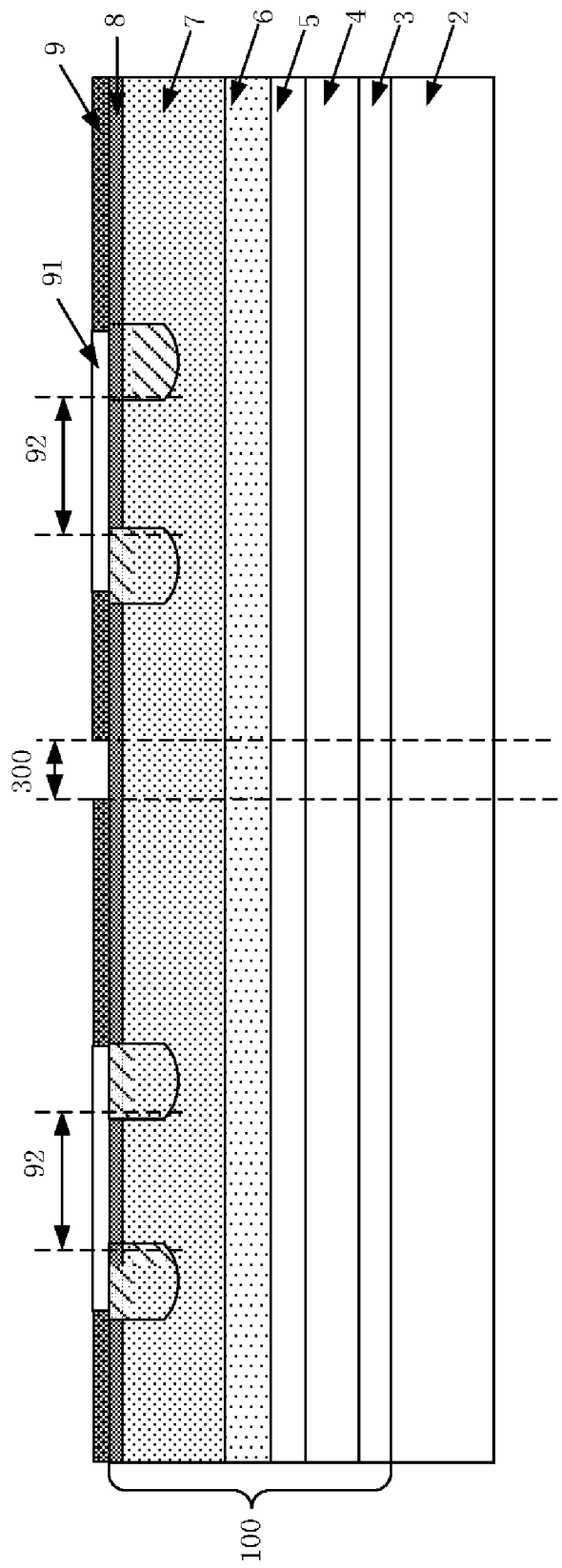

As shown in FIG. 9, the passivation film 9 in the first annular region to form a second diffusion window 92. In this step, the passivation film 9 can be patterned by photolithography, reactive ion etching (RIE), or wet etching.

Figure 10:
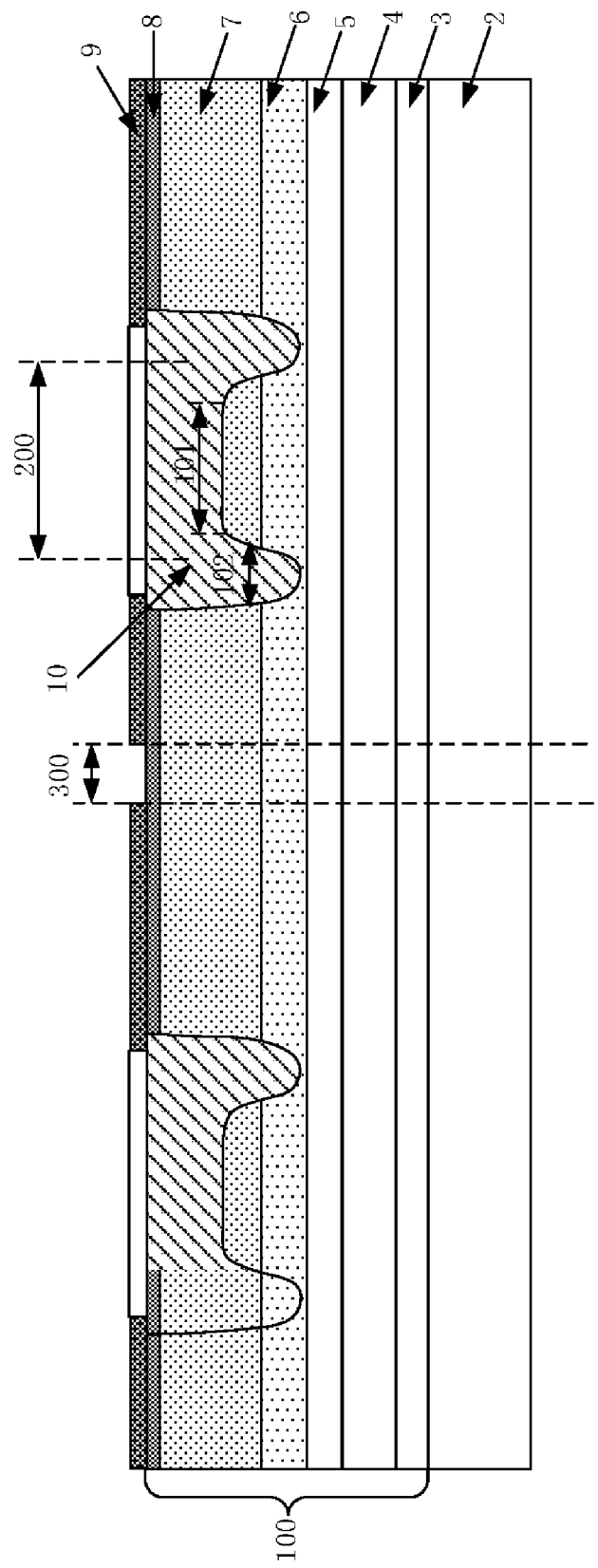

Finally, as shown in FIG. 10, second Zn diffusion is performed based on the first diffusion window 91 and the second diffusion window 92 to form the first diffusion region 101 and the second diffusion region 102.

The top layer 7 is N-type, the Zn diffusion region 10 is P-type, and the first diffusion region 101 of the Zn diffusion region 10 can form a P-N junction with the top layer 7 below. The second diffusion region 102 of the Zn diffusion region 10 has a greater diffusion depth relative to the first diffusion region 101. The bottom of the second diffusion region 102 is located at the field control layer 6, and an annular protection structure is formed around the entire Zn diffusion region 10, so that the edge breakdown effect can be suppressed, and a photocurrent can be generated under a zero-volt bias.

As described above, a diffusion depth of the first diffusion region 101 is H1, a diffusion depth of the second diffusion region 102 is H2, a thickness of the contact layer is h1, a thickness of the top layer is h2, and a thickness of the field control layer is h3; wherein $h1<H1<h1+h2$, $h1+h2<H2<h1+h2+h3$.

Figure 11:
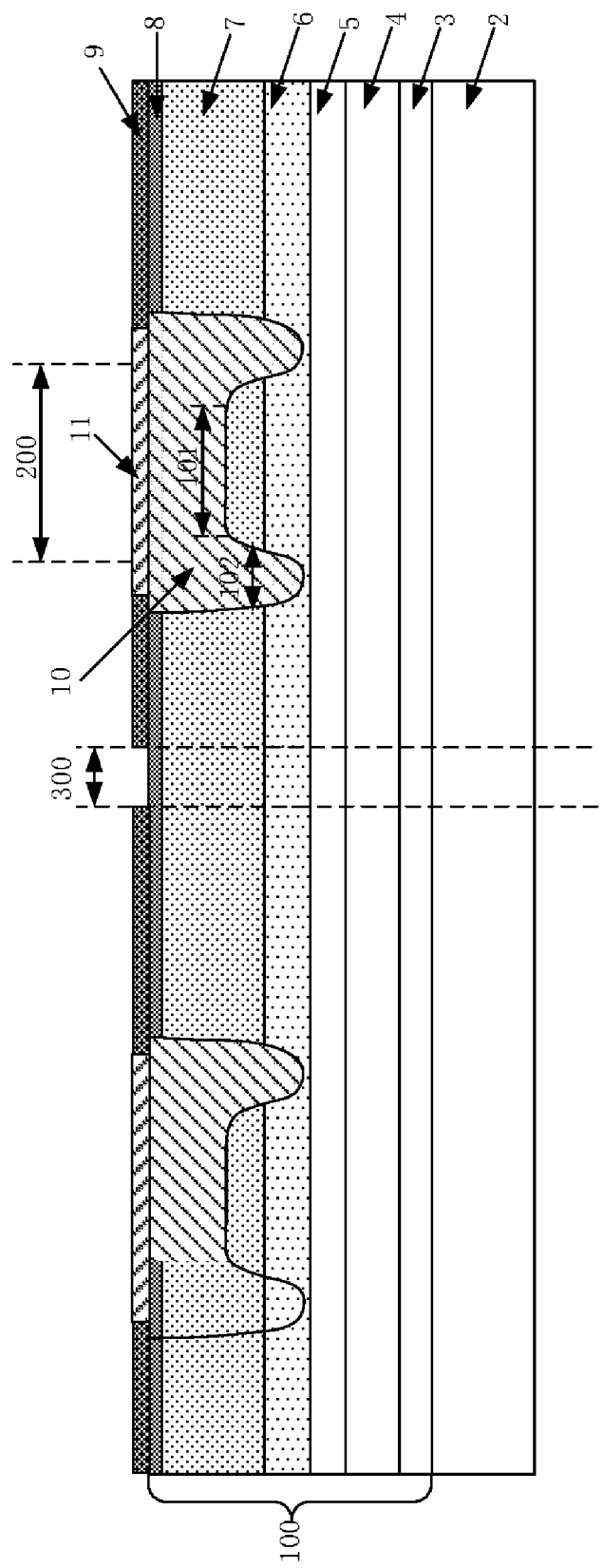
Figure 12:
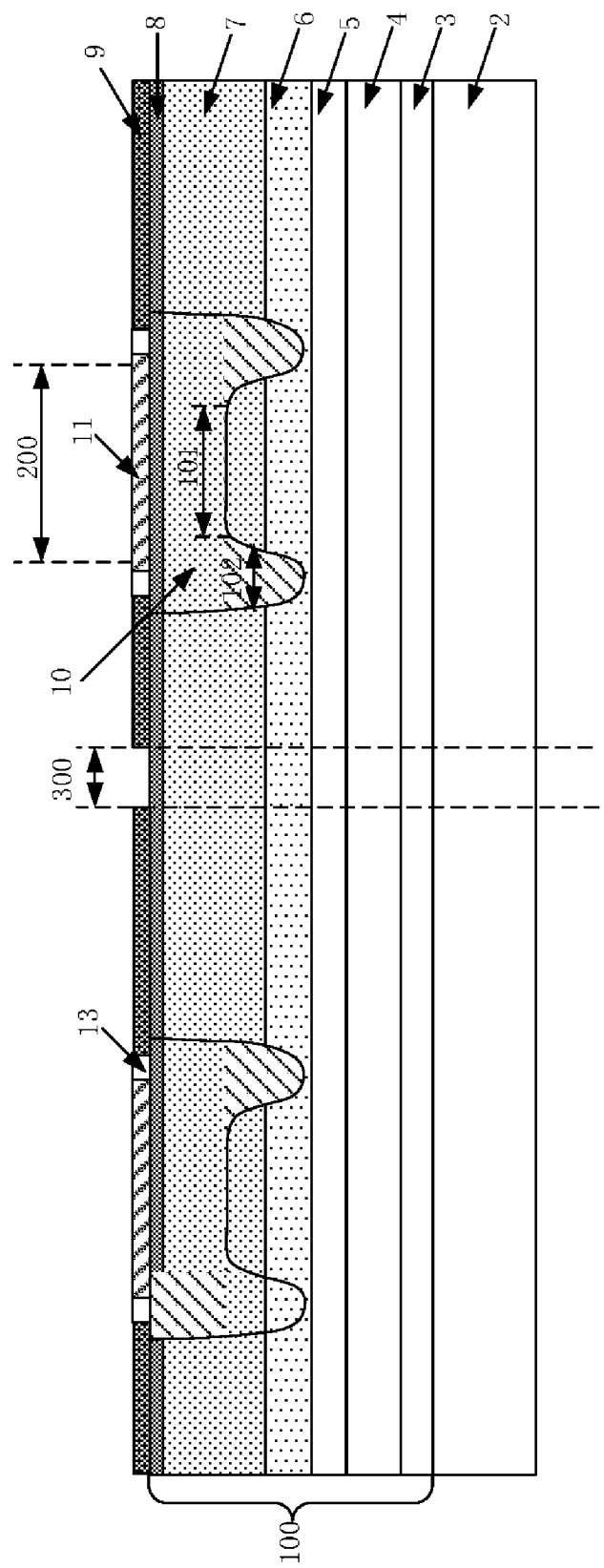
Figure 13:
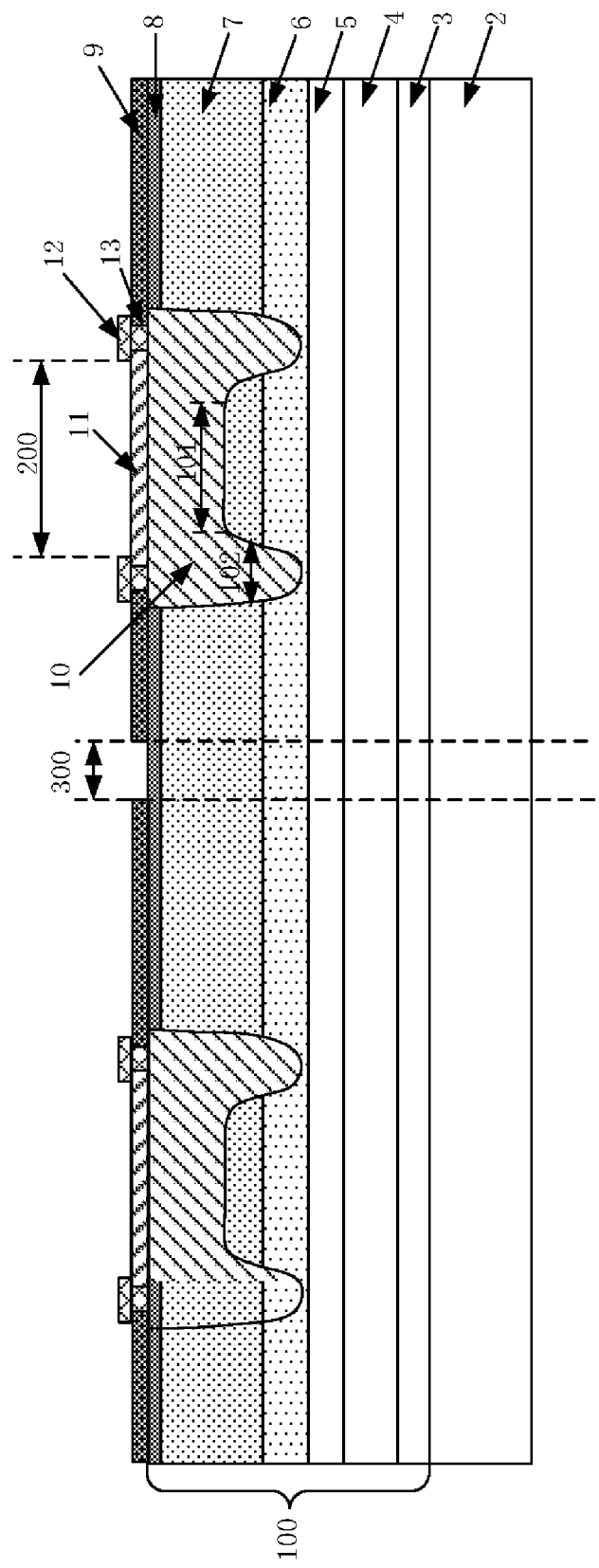

Step S12: As shown in FIGS. 11-13, form a patterned first electrode layer on one side of the epitaxial functional layer 100 facing away from the wafer, wherein the first electrode layer includes first electrodes 12 in one-to-one correspondence with the chip substrates 2. The first electrodes 12 are each a P electrode.

The first electrode layer can be formed by using a thermal evaporation process or an electron beam evaporation process. The first electrode layer may be Ti/Pt/Au sequentially formed. In this three-layer structure, Ti is formed first. In other methods, the first electrode layer may be Cr/Au formed sequentially, and Cr is formed first in the two-layer structure. The first electrode layer can be patterned by photolithography or wet etching.

In this step, the forming a patterned first electrode layer on one side of the epitaxial functional layer 100 facing away from the wafer includes:

First, as shown in FIG. 11, an antireflection film 11 covering the first diffusion window and the second diffusion window is formed.

Then, as shown in FIG. 12, an annular opening is formed on the antireflection film, wherein a region surrounded by the annular opening is the photosensitive region 200, and the annular opening is used as a first electrode through hole 13.

Finally, as shown in FIG. 13, the first electrode layer is formed on surfaces of both the antireflection film 11 and the passivation film 9, and the first electrode layer is patterned to form a plurality of first electrodes 12 in one-to-one correspondence with the chip substrates 2, wherein the first electrodes 12 are each in electrical contact with the diffusion region 10 through the corresponding first electrode through hole 13.

Figure 14:
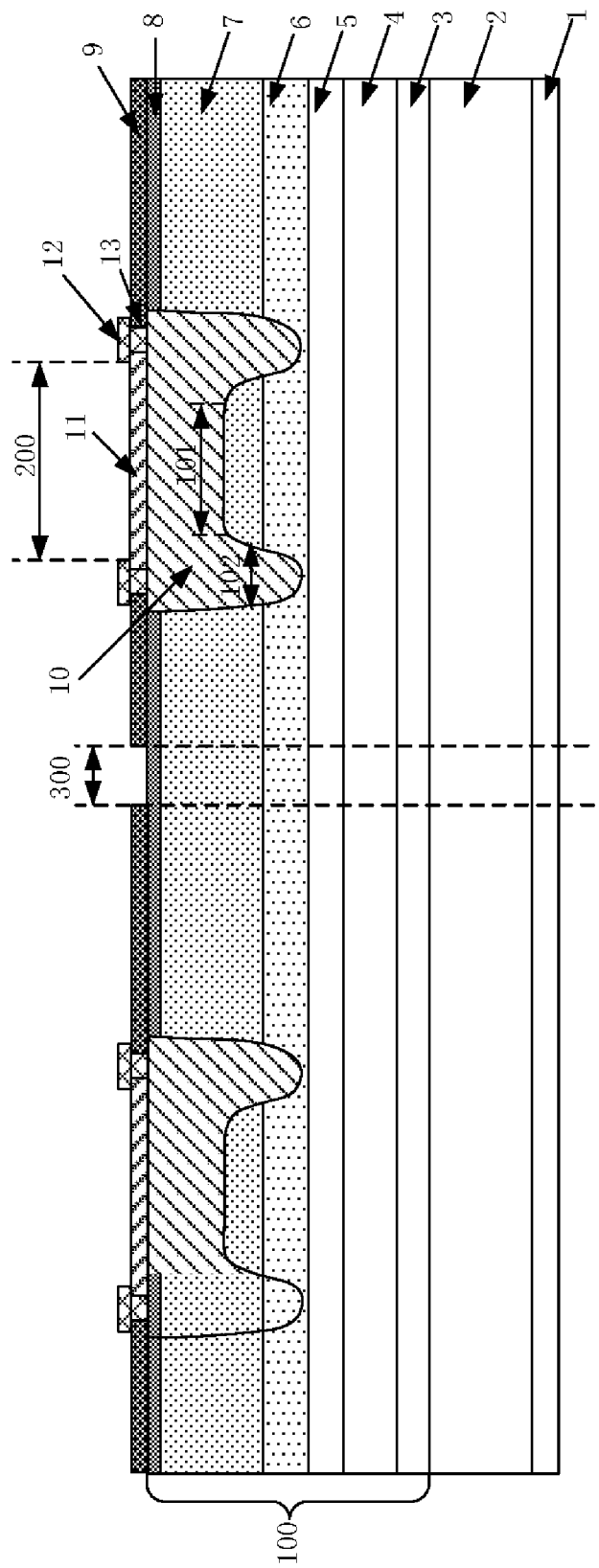

Step S13: As shown in FIG. 14, form a second electrode layer on the other side of the wafer.

Before the second electrode layer is formed, the other side of the wafer may be thinned to reduce the thickness of the wafer to 150 μm±5 μm. The second electrode layer can be formed by using a thermal evaporation process or an electron beam evaporation process. The second electrode layer may be an Au layer with a thickness greater than 0.5 μm.

Figure 15:
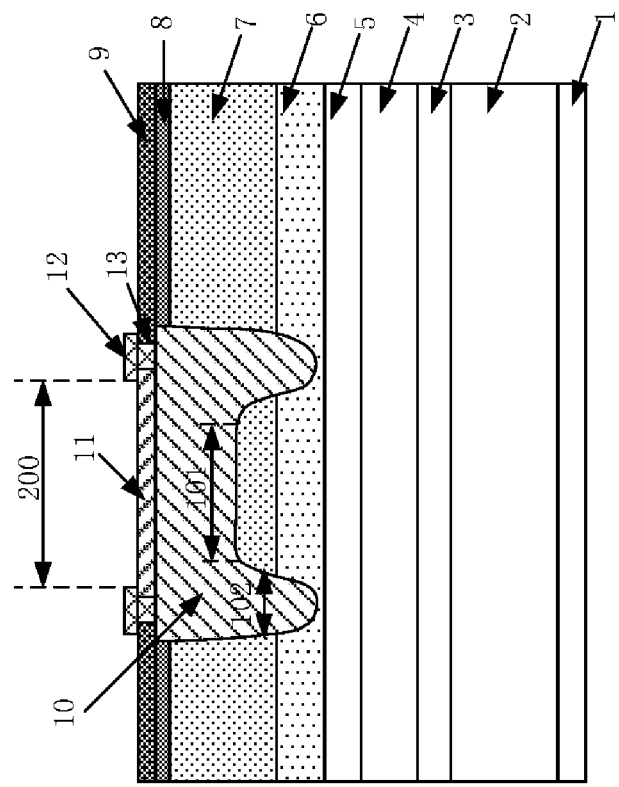

Step S14: As shown in FIG. 15, segment the wafer based on the cutting channel 300 to form a plurality of single-particle photodetectors. After segmentation, the second electrode layer forms a plurality of second electrodes 1 corresponding to the chip substrates 2. The second electrodes 1 are each an N electrode.

The manufacturing method described in the embodiment of the present invention can be used to manufacture the photodetector described in the above embodiment, the manufacturing method is simple, and the manufacturing cost is low. Experimental data shows that the photodetector has a detection range greater than 200 m and may have responsivity greater than 20 A/W and a dark current less than 10 nA.

Based on the above embodiment, another embodiment of the present invention further provides a lidar system, including the photodetector described in the above embodiment.

It should be noted that each embodiment of the present specification is described in a progressive manner, each embodiment focuses on the difference from other embodiments, and the same and similar parts between the embodiments may refer to each other.

It should be noted that relational terms such as "first" and "second" are only used to distinguish one entity or operation from another entity or operation, and do not necessarily require or imply that any such actual relationship or sequence is present between these entities or operations. Moreover, the term "comprise", "include", or any other variant thereof is intended to encompass a non-exclusive inclusion, such that a process, method, article, or device that includes a series of elements includes not only those elements, but also other elements not explicitly listed, or elements that are inherent to such a process, method, article, or device. Without more restrictions, an element defined by the phrase "including a . . . " does not exclude the presence of another same element in a process, method, article, or device that includes the element.

The above features mentioned in the specification, accompanying drawings and claims can be combined with each other arbitrarily as long as they are meaningful within the present invention.

The above are only specific embodiments of the present invention, so that those skilled in the art can understand or implement the present invention. Various modifications to these embodiments are readily apparent to those skilled in the art, and the general principles defined herein can be implemented in other embodiments without departing from the spirit or scope of the present invention. Therefore, the present invention is not limited to the embodiments shown herein but falls within the widest scope consistent with the principles and novel features applied for herein.

What is claimed is:

1. A photodetector being an avalanche photodetector for a lidar system, comprising:
    a chip substrate;
    an epitaxial functional layer, wherein the epitaxial functional layer is arranged on a surface of one side of the chip substrate; the epitaxial functional layer comprises a circular photosensitive region, and a range of a diameter of the photosensitive region is 100 μm-300 μm;
    a first electrode arranged on a surface of one side of the epitaxial functional layer facing away from the chip substrate; and
    a second electrode arranged on a surface of the other side of the chip substrate,
    wherein the epitaxial functional layer comprises a buffer layer, an absorption layer, a transition layer, a field control layer, a top layer, and a contact layer which are sequentially arranged on the chip substrate,
    wherein the epitaxial functional layer has a Zn diffusion region, the Zn diffusion region comprises a first diffusion region and a second diffusion region surrounding the first diffusion region,
    wherein a bottom of the second diffusion region is located in the field control layer.

2. The photodetector according to claim 1, wherein the absorption layer is an InGaAs absorption layer.

3. A lidar system, comprising the photodetector according to claim 2.

4. The photodetector according to claim 1, wherein
    a diffusion depth of the first diffusion region is H1, a diffusion depth of the second diffusion region is H2, a thickness of the contact layer is h1, a thickness of the top layer is h2, and a thickness of the field control layer is h3,
    wherein h1<H1<h1+h2, h1+h2<H2<h1+h2+h3;
    and/or
    a thickness of the absorption layer has a thickness which is less than 3.5 μm;
    and/or
    the chip substrate is an N-type semi-insulating InP substrate; the buffer layer is an InP buffer layer; the transition layer is an InGaAsP transition layer; the field control layer is an InP field control layer; the top layer is an InP top layer; and the contact layer is an InGaAsP contact layer.

5. A lidar system, comprising the photodetector according to claim 4.

6. The photodetector according to claim 1, wherein the surface of one side of the epitaxial functional layer facing away from the chip substrate is provided with a passivation film, the passivation film surrounds the photosensitive region, a first electrode through hole is formed between the passivation film and the photosensitive region, and the first electrode is in electrical contact with the epitaxial functional layer through the first electrode through hole.

7. The photodetector according to claim 6, wherein the passivation film comprises a silicon nitride layer and a silicon oxide layer which are laminated;
    and/or
    a surface of the photosensitive region is covered with an antireflection film;
    and/or
    a diameter of the photosensitive region has a diameter which is 200 μm.

8. A lidar system, comprising the photodetector according to claim 7.

9. A lidar system, comprising the photodetector according to claim 6.

10. A lidar system, comprising the photodetector according to claim 1.

11. A manufacturing method for a photodetector, wherein comprising:
    providing a wafer, wherein the wafer comprises a plurality of chip substrates, and a cutting channel is provided between adjacent chip substrates;
    forming an epitaxial functional layer on a surface of one side of the wafer, wherein the epitaxial functional layer corresponding to each of the chip substrates comprises a circular photosensitive region, and a range of a diameter of the photosensitive region is 100 μm-300 μm;
    forming a patterned first electrode layer on one side of the epitaxial functional layer facing away from the wafer, wherein the first electrode layer comprises first electrodes in one-to-one correspondence with the chip substrates;
    forming a second electrode layer on the other side of the wafer; and
    segmenting the wafer based on the cutting channel to form a plurality of single-particle photodetectors; wherein after segmentation, the second electrode layer forms a plurality of second electrodes in one-to-one correspondence with the chip substrates,
    wherein forming the epitaxial functional layer on a surface of one side of the wafer comprises:
    sequentially growing a buffer layer, an absorption layer, a transition layer, a field control layer, a top layer, and a contact layer on the wafer,
    wherein the epitaxial functional layer has a Zn diffusion region, the Zn diffusion region comprises a first diffusion region and a second diffusion region surrounding the first diffusion region,
    wherein a bottom of the second diffusion region is located in the field control layer.

12. The manufacturing method according to claim 11, wherein the absorption layer is an InGaAs absorption layer.

13. The manufacturing method according to claim 11, wherein a method for forming the Zn diffusion region comprises:
    forming a passivation film on a surface of the contact layer;
    patterning the passivation film to form a first annular region as a first diffusion window; wherein the passivation film corresponding to each of the chip substrates is provided with one first annular region;
    performing a first Zn diffusion based on the first diffusion window;

removing the passivation film in the first annular region to form a second diffusion window; and performing a second Zn diffusion based on the first diffusion window and the second diffusion window to form the first diffusion region and the second diffusion region.

14. The manufacturing method according to claim 13, wherein a diffusion depth of the first diffusion region has a diffusion depth of is $H1$, a diffusion depth of the second diffusion region has a diffusion depth of is $H2$, a thickness of the contact layer has a thickness of is $h1$, a thickness of the top layer has a thickness of is $h2$, and a thickness of the field control layer has a thickness of is $h3$;

wherein $h1 < H1 < h1+h2$, $h1+h2 < H2 < h1+h2+h3$.

15. The manufacturing method according to claim 14, wherein forming the patterned first electrode layer on one side of the epitaxial functional layer facing away from the wafer comprises:

forming an antireflection film covering the first diffusion window and the second diffusion window;

forming an annular opening on the antireflection film, wherein the region surrounded by the annular opening is the photosensitive region, and the annular opening is used as a first electrode through hole; and forming the first electrode layer on surfaces of both the antireflection film and the passivation film, and patterning the first electrode layer to form a plurality of first electrodes in one-to-one correspondence with the chip substrates, wherein the first electrodes are each in electrical contact with the diffusion region through the corresponding first electrode through hole.

* * * * *